United States Patent
Chatterjee et al.

[11] Patent Number: 5,909,628
[45] Date of Patent: Jun. 1, 1999

[54] REDUCING NON-UNIFORMITY IN A REFILL LAYER THICKNESS FOR A SEMICONDUCTOR DEVICE

[75] Inventors: Amitava Chatterjee, Plano; Theodore W. Houston; Ih-Chin Chen, both of Richardson; Agerico L. Esquirel, Dallas; Somnath Nag; Iqbal Ali, both of Plano; Keith A. Joyner, Richardson; Yin Hu, Plano; Jeffrey Alan McKee, Grapevine; Peter Stewart McAnally, McKinney, all of Tex.

[73] Assignee: Texas Instruments Incorporated, Dallas, Tex.

[21] Appl. No.: 08/804,484

[22] Filed: Feb. 21, 1997

Related U.S. Application Data

[60] Provisional application No. 60/011,988, Feb. 21, 1996.

[51] Int. Cl.⁶ .................................................. H01L 21/76
[52] U.S. Cl. ..................... 438/424; 438/52; 148/DIG. 50
[58] Field of Search ..................... 438/404, 412, 438/424, 427

[56] References Cited

U.S. PATENT DOCUMENTS

| | | | |
|---|---|---|---|
| 5,234,861 | 8/1993 | Roisen et al. | 437/67 |
| 5,264,387 | 11/1993 | Beyer et al. | 437/62 |
| 5,308,786 | 5/1994 | Lur et al. | 437/67 |
| 5,372,968 | 12/1994 | Lur et al. | 437/67 |
| 5,374,583 | 12/1994 | Lur et al. | 148/DIG. 50 |
| 5,426,070 | 6/1995 | Shaw et al. | 438/52 |
| 5,516,720 | 5/1996 | Lur et al. | 437/67 |
| 5,691,230 | 11/1997 | Forbes | 148/DIG. 50 |
| 5,750,433 | 5/1998 | Jo | 438/424 |

FOREIGN PATENT DOCUMENTS

| | | |
|---|---|---|
| 0 340 524 A1 | 4/1989 | European Pat. Off. . |
| 0 588 747 A2 | 8/1993 | European Pat. Off. . |
| 0 744 766 A2 | 3/1996 | European Pat. Off. . |

*Primary Examiner*—Charles Bowers
*Assistant Examiner*—David S Blum
*Attorney, Agent, or Firm*—Mark A. Valetti; Carlton H. Hoel; Richard L. Donaldson

[57] ABSTRACT

A technique of producing a semiconductor device or integrated circuit produces a planarized refill layer which has a more uniform thickness after polishing, such as by chemical-mechanical polishing (CMP). Dummy active areas are inserted between active areas in that portion of the substrate which would normally be occupied by a field oxide in order to reduce to "dishing" that occurs during CMP in these areas. The dummy active areas can take the shape of a large block, a partially or completely formed ring structure or a plurality of pillars the area density of which can be adjusted to match the area density of the active areas in that region of the substrate. The design rule for the pillars can be such that no pillars are placed where polycrystalline silicon lines or first level metallization lines are to be placed in order to avoid parasitic capacitances.

31 Claims, 7 Drawing Sheets ic # REDUCING NON-UNIFORMITY IN A REFILL LAYER THICKNESS FOR A SEMICONDUCTOR DEVICE

This application claims priority under 35USC§119(e)(1) of provisional application No. 60/011,988, filed Feb. 21, 1996.

This application is related to copending application Ser. No. 08/804,452, filed on Feb. 21, 1997 of this application (TI-20798), which is incorporated herein by reference.

BACKGROUND OF THE INVENTION

Chemical-mechanical polishing (CMP) is a modern technique for planarizing the layer of isolation material that is grown or deposited between active areas of a semiconductor substrate. The term "active area" is commonly used to describe that portion of the semiconductor substrate on which components are built, such as transistors, capacitors and resistors. As is well known in the art, in order to prevent conduction or crosstalk between active areas on a substrate, an electrical isolation material, referred to herein as a refill material, is placed between the active regions. One common method for making space for the refill material, is to etch a trench into the silicon substrate, by methods well known in the art. This space is then filled (refilled) with the isolation material. A common refill material is silicon dioxide.

The top of the refill layer is not planar because of the differences in topography of the surface of the substrate caused by the presence of active areas and some portions of the substrate and not in others. This is clearly illustrated in FIG. 1A in which the semiconductor device 100 being fabricated has reached the stage in which the refill layer has been deposited. In FIG. 1A the substrate 102 has active areas of silicon 104 separated by trenches 112 on the substrate 102. Notice that the trenches between active areas A, B and C are much narrower than the trench between active areas C and D. On top of each of the active areas is an isolation layer 106 which is typically a pad oxide of silicon dioxide. As used herein "isolation layer" refers to a layer which provides electrical and/or physical isolation. On top of the pad oxide 106 is a isolation layer 108, which is typically silicon nitride. Once the trenches have been made, the area between the trenches are filled with refill layer 110, such as silicon dioxide. As can clearly be seen in FIG. 1A, the refill layer does not have a flat topography, but has significant protrusions above the active areas A, B, C and D. Where there are no active areas, such as between active areas C and D, the deposition is relatively flat.

As is well known in the art, it is desirable to have a flat or planarized surface for the refill layer 110 in order that subsequent layers of the semiconductor device be built on a flat surface. In order to achieve this planarized effect, one technique that is commonly used is CMP. FIG. 1B shows the results of device 100 after CMP. Layer 114 is layer 110 after it has been planarized by the CMP operation. The CMP operation stops when it reaches the silicon nitride 108 thus leaving the refill layer 114 slightly below the top of the silicon nitride layer 108. This can be clearly seen in the areas between active layers A and B and active layers B and C. However, where there is a significant distance between active areas, such as between active areas C and D, the refill layer 114 is overpolished causing significant "dishing" 116 which results in a non-planarized surface. More significantly, active area D has been overpolished to the extent that the silicon nitride layer 108, the silicon dioxide layer 106 has been completely polished away and a portion of the active area silicon 104 has been polished away. The overpolishing will impair device performance, reliability and yield. It is believed that the overpolishing for active area D is caused by the unevenness in pressure that is applied because of the difference in the area density between the area encompassing active areas A, B, and C and the area which only has active area D. The term "area density" refers to the percentage of any portion of the substrate that contains active area, in contrast to refill material or trench.

FIG. 1C shows a TEM cross section of an active area after nitride strip. The active silicon area is covered by a delineating polycrystalline silicon layer which has been deposited on the surface which is in turn covered by a silicon nitride area which appears as a dark black line. It can clearly be seen from this figure that there is damage and trenching into the active silicon area. In contrast, the photograph in FIG. 1D shows a similar area in which no damage has occurred. Note the presence of the pad oxide which appears as a thin white line between the active silicon and the delineating polycrystalline silicon layer which shows that there has been no silicon exposure during the CMP.

Accordingly, there is a need for a low-cost and effective method for reducing such overpolishing.

SUMMARY OF THE INVENTION

It is a general object of the present invention to reduce non-uniformity in the refill layer thickness after planarization.

It is a further object of the present invention to provide a reduced non-uniformity in the refill layer thickness after CMP.

A still further object of the present invention is to prevent overpolishing of the refill layer of a semiconductor device during CMP.

Yet another object of the present invention is to prevent overpolishing of a refill area of a semiconductor device after planarization.

These and other objects, advantages and features are provided, in accordance with one aspect of the present invention by a method for isolating an active area of a MOS semiconductor device in which a first isolation layer is formed over the substrate. A first area of a substrate which will become an active area of the device and a second area of the substrate adjacent to and spaced from the active area which will become a dummy active area of the device are defined. A refill layer is deposited over the first isolation layer. The refill layer is polished using chemical-mechanical polishing (CMP) until the first isolation layer is exposed.

Another aspect of the invention includes a method for isolating an active area of a MOS semiconductor device in which a first isolation layer is formed over the substrate. A first area of a substrate which will become an active area of the device and a plurality of second areas of the substrate adjacent to and spaced from the active area which will become dummy active areas of the device are defined. A refill layer is formed over the first isolation layer. The refill layer is planarized to produce a substantially flat upper surface in which the first isolation layer is exposed.

Yet another aspect of the invention comprises a method of reducing overpolishing in a process for planarizing a refill layer of a MOS device, in which at the same time active areas of the substrate are formed, at least one dummy active area on the substrate adjacent to but spaced from at least one of the active areas is formed. The refill layer is planarized by chemical-mechanical polishing (CMP).

A further aspect of the invention includes a MOS semiconductor device having a substrate and at least one active area on the substrate. At least one dummy active area on the substrate is being adjacent to but spaced from the active area. A planarized insulating layer is formed between the active area and dummy active area.

A still further aspect of the invention includes a MOS semiconductor device having a substrate and at least one active area on the substrate. At least one dummy active area on the substrate adjacent to but spaced from the active area, the dummy active area being in an area of the substrate covered by a field dielectric.

In an embodiment of the instant invention, no dummy active areas are formed in areas where gate lines are to be formed. In another embodiment of the instant invention, no dummy active areas are formed in areas where a first level of metallization will be formed.

DETAILED DESCRIPTION

Figure 1A:
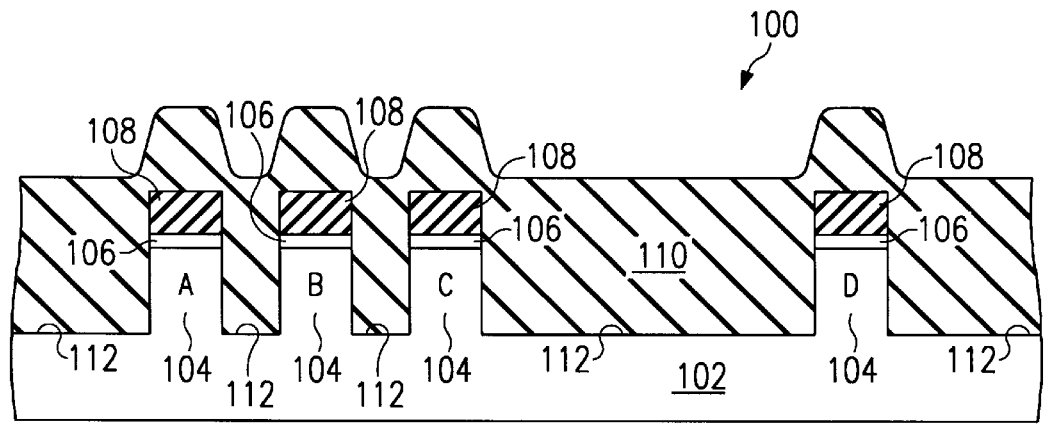
FIG. 1A shows a cross sectional view of prior art semiconductor device after a refill layer has been applied but before CMP.
Figure 1B:
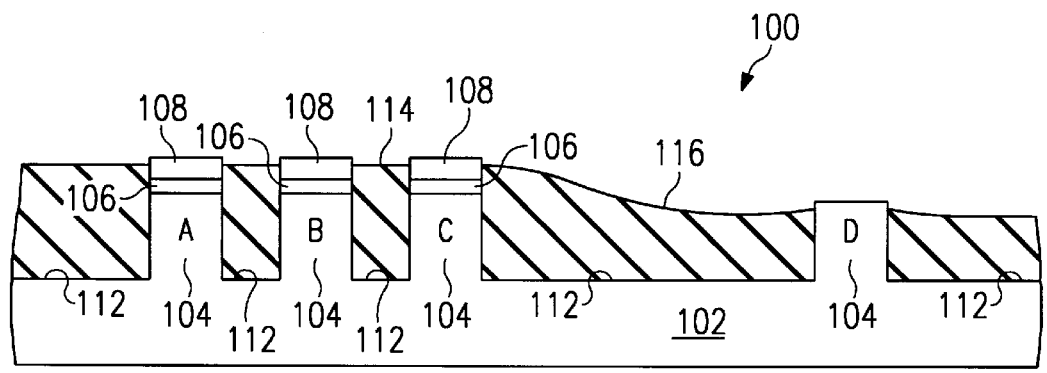
FIG. 1B shows a cross sectional view of the same device after CMP.

FIGS. 2A–2D show the process steps that are necessary to implement the present invention. The process starts with FIG. 2A in which a device 200 being fabricated has a silicon substrate 202 which has been covered with an isolation layer 204 which is a thermal pad or buffer oxide of 100–300 angstroms in thickness, for example. A silicon nitride layer 206 is formed on top of the pad oxide by chemical vapor deposition (CVD) or other suitable process to a thickness of 1,000–2,000 angstroms, for example. The pad oxide serves as a buffer between the silicon substrate and the silicon nitride because of the high stress at a silicon nitride-silicon interface which can cause dislocations in the silicon, as is well known to those skilled in the art. If any material other than silicon nitride is used as the isolation layer 206, the pad oxide 204 may not be required.

Figure 2A:
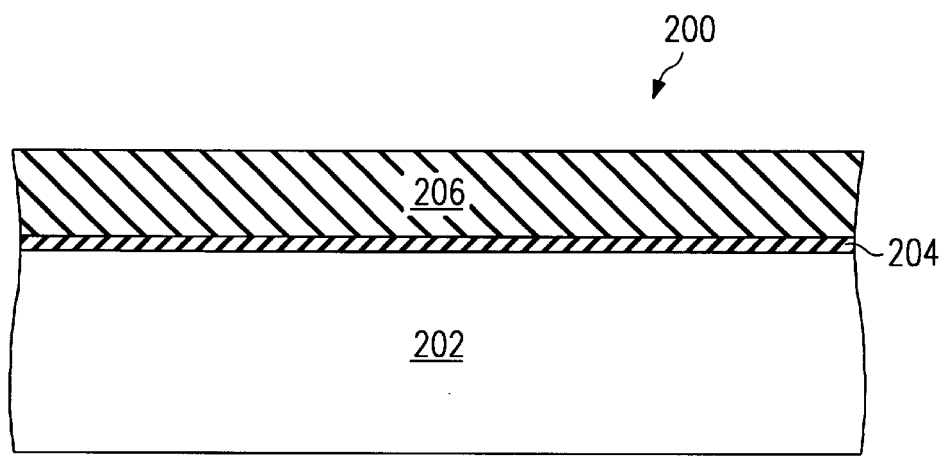
FIGS. 2A–2D show a cross sectional view of the steps necessary to fabricate a device in accordance with the present invention.
Figure 1C:
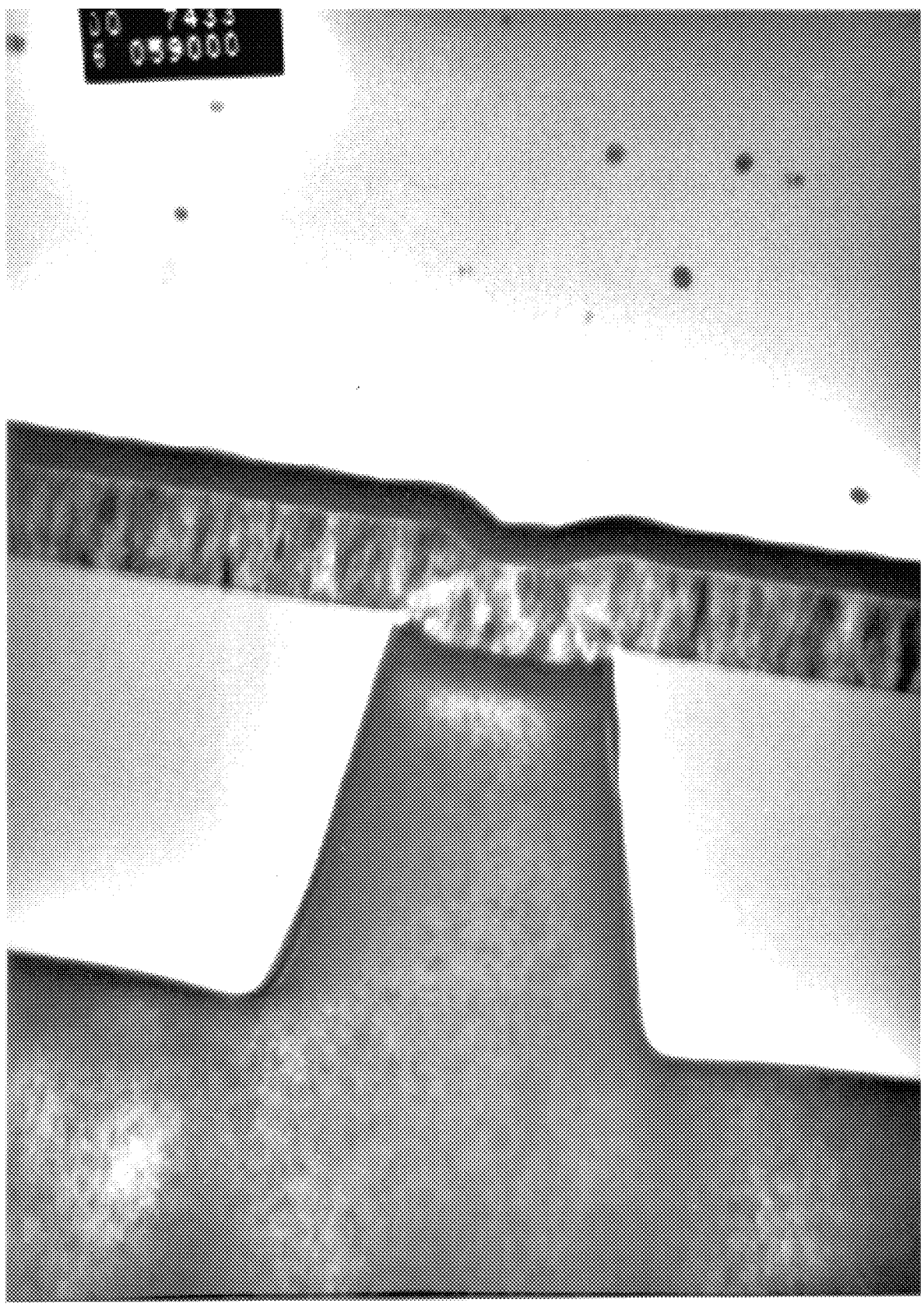
FIG. 1C shows a cross sectional view of a TEM cross section of a active area after nitride strip showing a damaged silicon area.
Figure 1D:
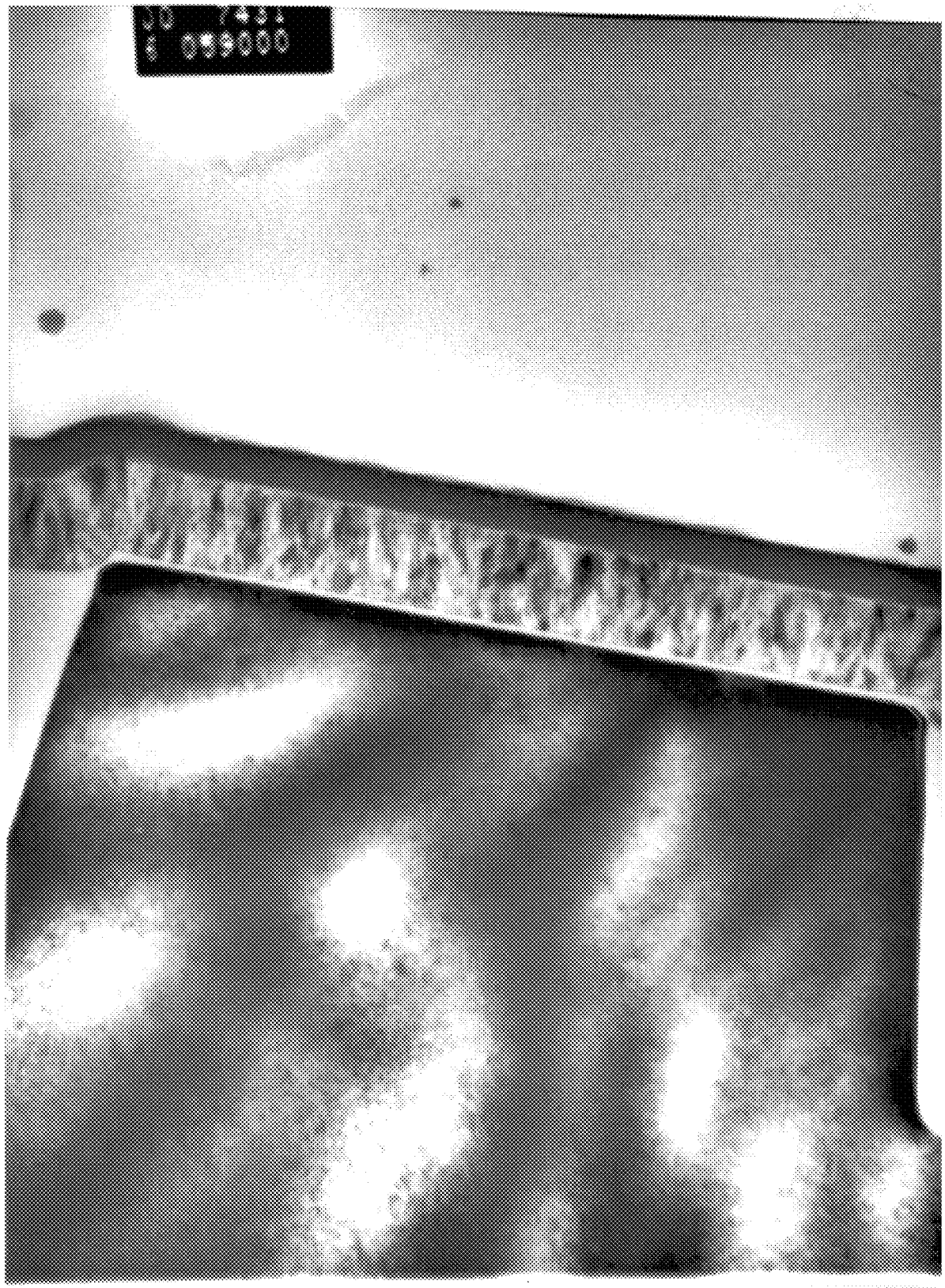
FIG. 1D shows a cross sectional view of a TEM cross section of an active area in which no damage has occurred.
Figure 2B:
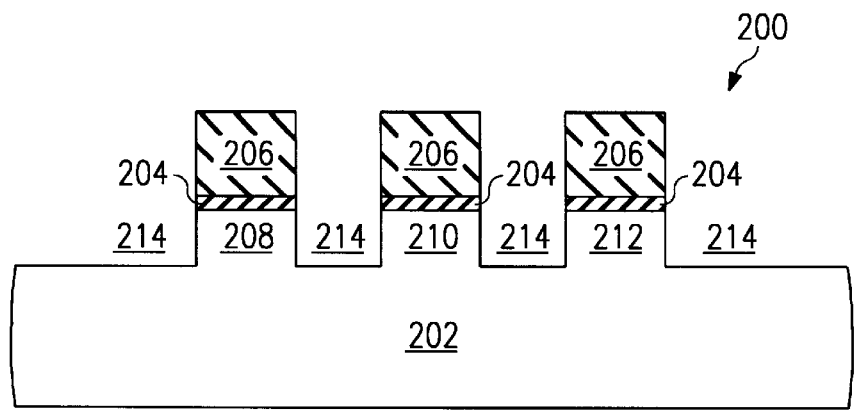

In FIG. 2B, the structure shown in FIG. 2A has been patterned into three areas 208, 210, 212. Between these areas, the silicon nitride layer 206 and silicon dioxide layer 204 are etched away to reveal the substrate 202 below. Then the substrate between areas 208 and 210 and area 210 and 212 as well as between area 208 and the circuity to the left of the drawing (not shown) and area 212 and the circuitry to the right of the drawing (not shown) are etched to form trenches 214 into the substrate, utilizing well known processes.

In FIG. 2B, area 210 will become an active area whereas areas 208 and 212 will be "dummy" active areas. The term "dummy active area" as used herein is an area of the substrate which is formed in the same manner as the active areas, which is later not developed into an active or passive device. As will be seen, the dummy active areas 208 and 212 will serve to protect the active area 210 during further processing using CMP.

Figure 2C:
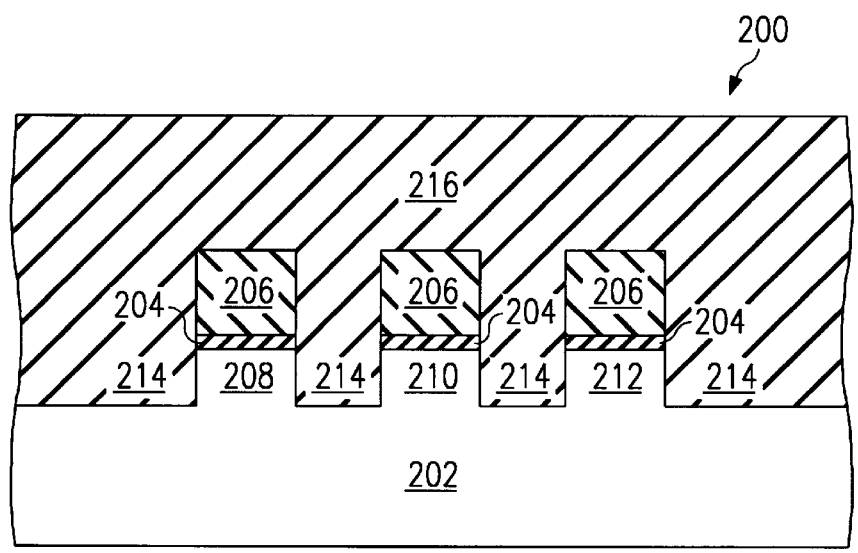

In FIG. 2C a refill layer 216 is deposited over the substrate in order to fill the trenches 214. As is known to those skilled in the art, the refill layer 216 will be deposited over the active and dummy active areas as well. The refill layer 216 can be silicon dioxide, as is well known in the art; however, HDP, densified SACVD, TEOS and HSQ films can also be utilized. HDP and densified TEOS showed low variation across the substrate. HDP is preferred because of a known problem of incomplete gap-fill TEOS in submicrometer geometry.

Figure 2D:
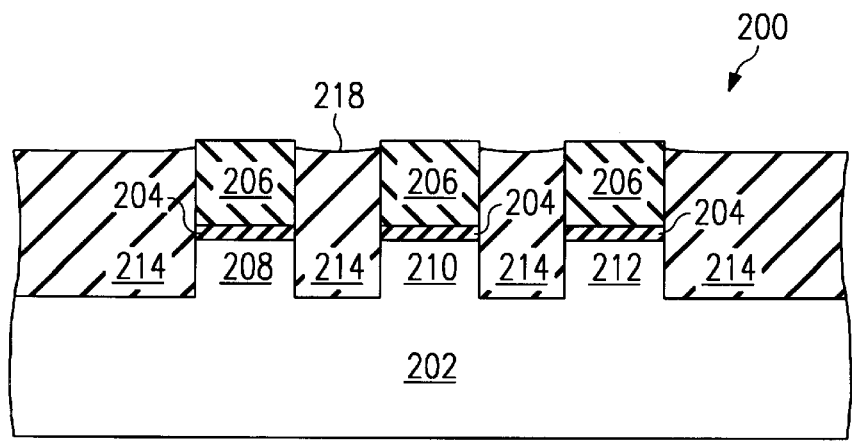

The surface of the refill layer 216 is then planarized using CMP in order to remove the refill layer from above active area 210 and dummy active areas 208 and 212. The CMP process proceeds until the nitride layer 206 is detected, when the process is halted. The result of the CMP process is shown if FIG. 2D. In FIG. 2D, the planarized refill layer 216 is shown as 218. As can be seen from FIG. 2D, the CMP process is continued until the refill layer is slightly below the nitride layer 206. The pad utilized in the CMP process caused some minor dishing to occur in the trench between dummy active layer 208 and active layer 210 and the trench between active layer 210 and dummy active layer 212. However, this dishing is very minor and the trench is substantially filled with the refill material. The important feature shown in FIG. 2D is that the nitride layer 206 is substantially intact that none of the pad layer 204 or active area 210 has been removed. Thus, the device will be fully functional. There is some dishing at the left and right hand portions of the figure because none of the circuitry was shown on these portions of the substrate. If there is no circuitry nearby, this dishing can be accepted. The dummy active area principle can be utilized to eliminate this dishing problem, as well, if needed.

Figure 3A:
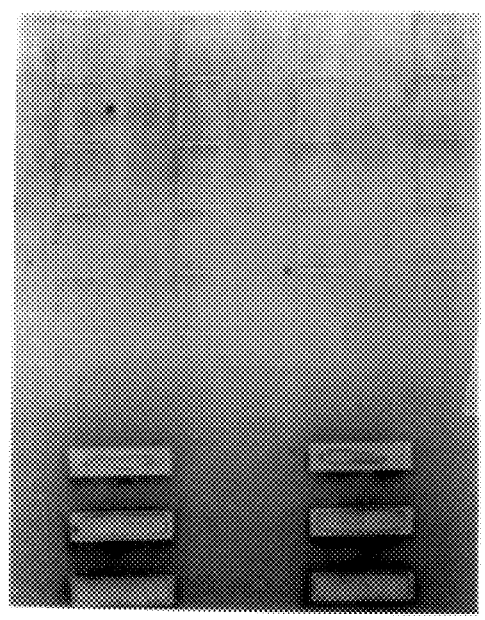
FIG. 3A shows TEM photomicrograph of a device made in accordance with the prior art, post nitride strip.
Figure 3B:
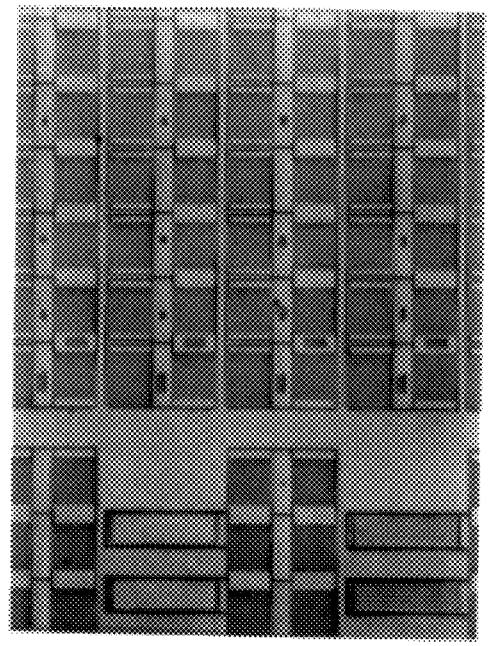
FIG. 3B shows the same device in which the present invention has been employed.

FIGS. 3A and 3B compare the present invention to the prior art technique. The same circuitry is utilized in both FIGS. 3A and 3B, with the exception that dummy active areas were inserted into the field regions in FIG. 3B to reduce the variation in the refill layer thickness. As can be seen, the design of FIG. 3A has large variations in active and field regions whereas in FIG. 3B, dummy active areas have been inserted. The Figures show TEM photomicrographs of the circuits post-nitride strip. For both cases, care was taken to use the minimum polish time necessary to expose the nitride by verifying that the nitride remaining after CMP in large active areas was within 400 angstroms of the deposited thickness. The dummy active areas in FIG. 3B are those areas not present in FIG. 3A. As can be seen from FIG. 3A, the circuitry to the left of the photograph is heavily damaged. On the right side of FIG. 3A there are two groups of three active areas. Very close examination of these three active areas reveals different amounts of damage. The left most of the three active areas shows heavy damage. Close examination shows an irregular elliptical shaped area in the center of the active area, which represents the undamaged portion. The remaining area within the active area has been damaged. Moving over to the area adjacent to this area on the right, the center active area, can be seen that this irregular elliptical area has been expanded and covers a greater portion of the active area. The right most of these three active areas shows almost the entire active area is covered within this ring, indicating virtually no damage. Thus, it can be seen that the two left most structures have served to some degree to protect the right most structure.

Referring to FIG. 3B, the identical circuitry is shown except that the third or right most active area is not shown in this photograph. However, it can clearly be seen be looking at the two rectangular active areas at the top right side of FIG. 3B and the two rectangular active areas at the bottom right side of FIG. 3B that there is no damage to these areas. Furthermore, the dark spots on the left side of FIG. 3B are test transistors that are protected by the dummy active areas. These test transistors are almost completely obliterated in FIG. 3A. Note that there is a space between the dummy active area and the active area which is required for isolation purposes. Also note that there are open areas on the surface of the substrate where polycrystalline silicon and the first layer of metal will be formed. The reason for this is explained below.

Figure 4A:
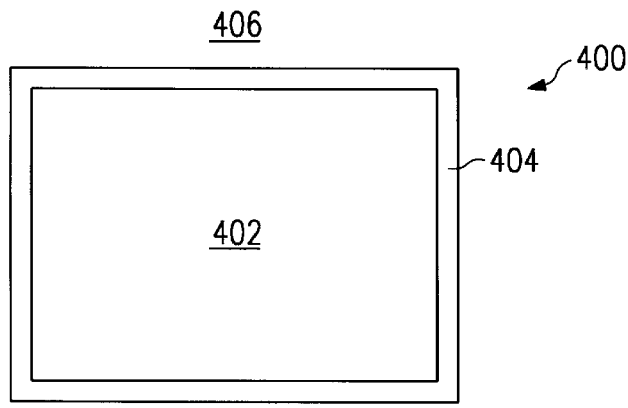
FIGS. 4A and 4B show plan views of design rules for implementing the present invention.
Figure 4B:
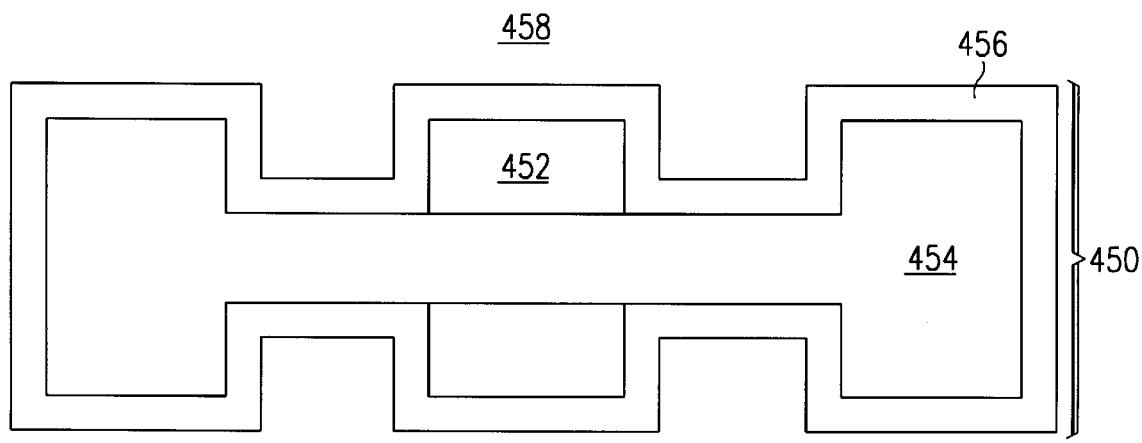

FIGS. 4A and 4B show design rules for implementing the present invention. FIG. 4A shows an active device 400 surrounding by a dummy active device. In FIG. 4A, the active areas 402 is isolated from the dummy active area 406 by a trench 404. It is necessary that the dummy active regions be isolated from the active regions but the spaces between the dummy active regions and active regions need not be uniform as shown in FIG. 4A. In FIG. 4B, device 450 is shown surrounded by a dummy active area 458. In device 450, active area 452 has a polycrystalline silicon gate line 454 including two gate pads crossing the active area. The active area 452 and polycrystalline silicon area 454 are separated from the dummy active area 458 by a trench 456. In FIG. 4B, the trenches shown as being uniform; however, this is not required. The dummy active areas should exclude regions where polycrystalline silicon will be present in order to avoid parasitic capacitance and unnecessary thin oxide edges that can reduce gate oxide integrity. It is also desirable that the active area exclude areas which will be covered by first level metallization in order to avoid parasitic capacitances.

Figure 5:
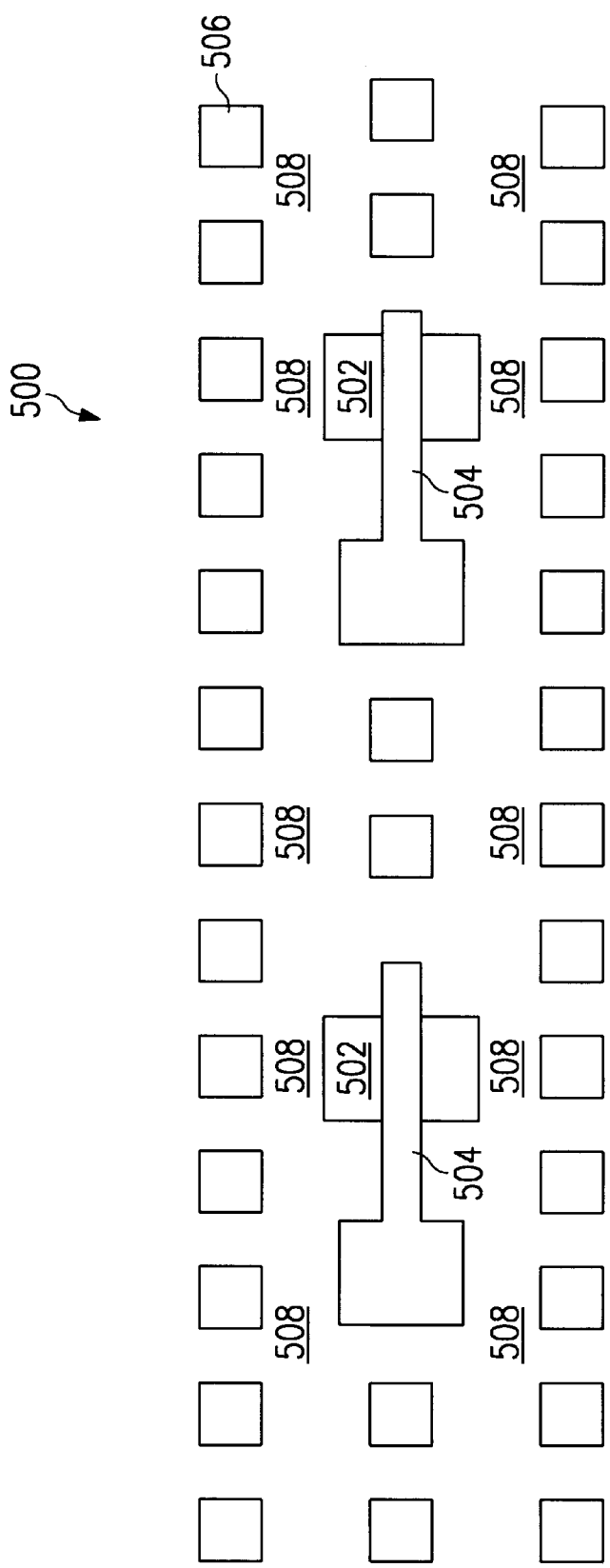
FIG. 5 shows a plan view of an alternate embodiment of the present invention in which pillars are utilized.

One way of accomplishing this goal and to also avoid unnecessary increase in the metal to substrate parasitic capacitance is to utilize "pillars" of dummy active area instead of one large block. FIG. 5 shows an embodiment in which the dummy active area 506 is placed in the form of pillars around the active areas 502 and the polycrystalline silicon areas 504. Note that each pillar is separated from the active area of polycrystalline silicon area by a trench 508 of variable width. This technique can also be applied to eliminate parasitic capacitance due to first level metallization. The design rule could be generated that would simply eliminate pillars in the area where polycrystalline silicon (or other gate material) or the first level metallization (or other level of interconnect) will appear. In FIG. 5, the area density of the pillars is shown to be uniform. However, the area density of the pillars can be adjusted to match the area density of the devices on the substrate, which can vary from one region of the substrate to another. The area density of the pillars can be made to approximate the area density of nearby active areas, or it can be adjusted to compensate for high or low area density of active areas to obtain a desired overall area density. The pillars are shown as uniform in size and shape in FIG. 5. However, pillars of various sizes and shapes an also be used. The pillars may be placed in a single row or spaced out into the field region. This will yield a uniform polish rate for the entire device. Utilization of pillars also prevents crosstalk between various devices which could be coupled through the dummy active areas.

Figure 6:
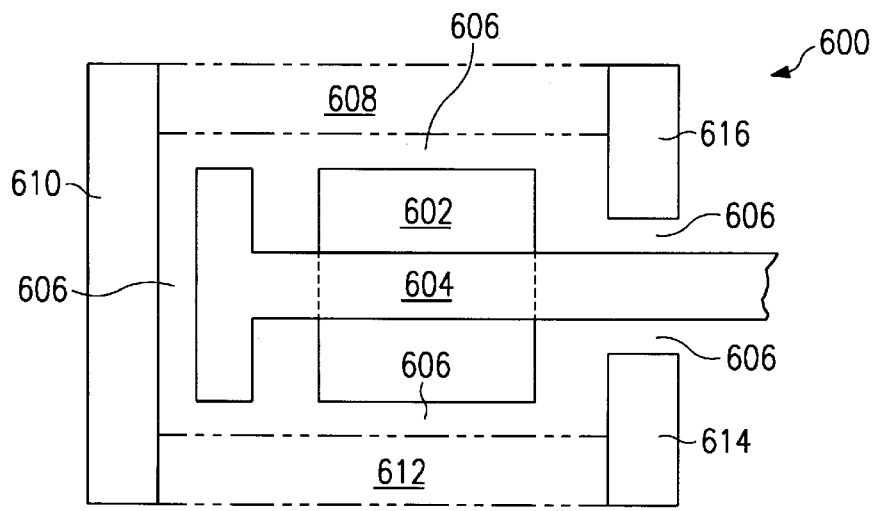
FIG. 6 shows a plan view of another embodiment of the present invention in which a ring structure is utilized.

FIG. 6 shows an alternative embodiment in which the area to be protected is surrounded by a ring, as shown as 600 in FIG. 6. In FIG. 6 the active area 602 has a polycrystalline silicon gate pad 604 which, as is common in many designs is connected to other devices (not shown). A ring comprising sections 608, 610, 612, 614 and 616 almost completely encloses the active area in polycrystalline silicon gate line and pad to protect this area from being overpolished during the CMP process. As shown in FIG. 6, the sections 608, 610, 612, 614 and 616 are not connected to each other as shown by the dashed lines. This will not affect the ability to protect the active area 602 and refill layer 606 from overpolishing, nor will the gap between blocks 614 and 616 to allow the polycrystalline silicon gate line 604 to exit the area. The sections 608, 610, 612, 614 and 616 could be connected to form a ring if desired and if the polycrystalline silicon line does not need to be connected to other portions of the circuit, this ring could be complete. It should also be noted that while a rectangular ring as shown, any suitable shape such as a circle, an ellipse, or an irregular shape can also be used. It should also be noted that the active area and optionally the polycrystalline silicon area are separated from the dummy active areas by a spacing created by refill layer 606 which need not be of constant width.

As is well known to those skilled in the art, after the CMP process is complete, the silicon nitride isolation layer is removed in a hot phosphoric etch, for example, and the silicon dioxide pad layer is removed by an HF etch, for example. The active areas are then exposed for completion of the components that will be formed therein. The dummy active areas do not have components formed therein. However, various patterns can be used for implantation into the dummy active areas, such as to include or exclude well implants, channel implants, etc. A pattern within a dummy active area could be to connect the dummy active area to the well potential or isolate it from the well or to create a pattern to reduce cross coupling through the dummy active area. The dummy active area could be developed into unconnected active areas if desired. These devices could be biased to minimize capacitance to the polycrystalline silicon layers.

While particular embodiments of the present invention have been disclosed herein, certain changes and modifications will readily occur to those skilled in the art. For example, although the refill layer as shown is being deposited herein, the present invention should also work with grown refill areas such as silicon dioxide. All such changes and modifications can be made without departing from the invention as defined by the appended claims.

What is claimed is:

1. A method for isolating an active area of a MOS semiconductor device comprising:

forming a first isolation layer over a substrate;

defining a first area of said substrate which will become an active area of the device and a second area of said substrate adjacent to and spaced from said active area which will become a dummy active area of the device;

wherein said dummy active area comprises a plurality of pillars of dummy active area, at least one of said pillars being adjacent to but separated from said active area;

depositing a refill layer over said first isolation layer; and polishing said refill layer using chemical-mechanical polishing (CMP) until said first isolation layer is exposed.

2. The method of claim 1 further comprising:

forming a second isolation layer of different material than said first isolation layer, prior to forming said first isolation layer.

3. The method of claim 1 further comprising the step of forming a trench between said active area and said dummy active area.

4. The method of claim 1 wherein said refill layer fills spaces on said substrate between said active area and said dummy active area.

5. The method of claim 1 wherein the area density of said pillars compensates for the area density of said active area.

6. The method of claim 5 wherein these are a plurality of active areas on different portions of said substrate and wherein the area density of said pillars for each area compensates for the area density of said active area in each portion of the substrate.

7. The method of claim 1 wherein no dummy active areas are formed in areas where gate lines are to be formed.

8. The method of claim 7 wherein a space is provided between said dummy active areas and areas where gate lines are to be formed.

9. The method of claim 1 wherein no dummy active areas are formed in areas where a first level of metallization will be formed.

10. The method of claim 9 wherein a space is provided between said dummy active area and areas where a first level of metallization will be formed.

11. The method of claim 1 wherein said dummy active area comprises at least a partial ring structure around said active area.

12. A method for isolating an active area of a MOS semiconductor device comprising:

forming a first isolation layer over a substrate;

defining a first area of said substrate which will become an active area of the device and a plurality of second areas of said substrate adjacent to and spaced from said active area which will become dummy active areas of the device;

wherein said dummy active area comprises a plurality of pillars of dummy active area, at least one of said pillars being adjacent to said active area;

forming a refill layer over said first isolation layer;

planarizing said refill layer to produce a substantially flat upper surface in which the first isolation layer is exposed.

13. The method of claim 12 further comprising forming a second isolation layer, of different material than said first isolation layer, prior to forming said first isolation layer.

14. The method of claim 12 further comprising the step of forming a trench between said active area and said dummy active area.

15. The method of claim 12 wherein said refill layer fills spaces on said substrate between one of said active areas and said dummy active area.

16. The method of claim 12 wherein the area density of said pillars matches the area density of said active area.

17. The method of claim 12 wherein there are a plurality of active areas on different portions of said substrate and wherein the area density of said pillar for each area compensates for the area density of said active area in each portion of the substrate.

18. The method of claim 12 wherein no dummy active areas are formed in areas where gate lines are to be formed.

19. The method of claim 12 wherein a space is provided between said dummy active areas and areas where gate lines are to be formed.

20. The method of claim 12 wherein no dummy active areas are formed in areas where a first level of metallization will be formed.

21. The method of claim 12 wherein a space is provided between said dummy active area and areas where a first level of metallization will be formed.

22. The method of claim 8 wherein said dummy active area comprises at least a partial ring structure around said active area.

23. In a process for planarizing a refill layer of a MOS device, a method of reducing overpolishing comprising the steps of:

forming, at the same time active areas of the substrate are formed, at least one dummy active area on said substrate adjacent to but spaced from at least one of said active areas;

wherein said dummy active area comprises a plurality of pillars of dummy active area, at least one of said pillars being adjacent to said active area; and planarizing said refill layer by chemical-mechanical polishing (CMP).

24. The method of claim 23 wherein said refill layer fills spaces on said substrate between said active area and said dummy active area.

25. The method of claim 23 wherein the area density of said pillars matches the area density of said active area.

26. The method of claim 23 wherein there are a plurality of active areas on different portions of said substrate and wherein the area density of said pillar for each area compensates for the area density of said active area in each portion of the substrate.

27. The method of claim 23 wherein no dummy active areas are formed in areas where gate lines are to be formed.

28. The method of claim 23 wherein a space is provided between said dummy active areas and areas where gate lines are to be formed.

29. The method of claim 23 wherein no dummy active areas are formed in areas where a first level of metallization will be formed.

30. The method of claim 23 wherein a space is provided between said dummy active area and areas where a level of metallization will be formed.

31. The method of claim 23 wherein said dummy active area comprises at least a partial ring structure around said active area.

* * * * *

UNITED STATES PATENT AND TRADEMARK OFFICE
CERTIFICATE OF CORRECTION

PATENT NO. : 5,909,628
DATED : 06/01/99
INVENTOR(S) : Amitava Chatterjee, et al

It is certified that error appears in the above-identified patent and that said Letters Patent is hereby corrected as shown below:

On the title page insert

-- [75] Amitava Chatterjee, Theodore W. Houston, Ih-Chin Chen, Agerico L. Esquivel, Somnath Nag, Iqbal Ali, Keith A. Joyner, Yin Hu, Jeffrey Alan Mckee, Peter Stewart McAna --

Signed and Sealed this

Eighteenth Day of July, 2000

Attest:

Q. TODD DICKINSON

*Attesting Officer*   *Director of Patents and Trademarks*